(12) United States Patent
Omori et al.

(10) Patent No.: US 11,081,409 B2
(45) Date of Patent: Aug. 3, 2021

(54) HEAT TREATMENT APPARATUS OF LIGHT IRRADIATION TYPE AND HEAT TREATMENT METHOD

(71) Applicant: SCREEN HOLDINGS CO., LTD., Kyoto (JP)

(72) Inventors: Mao Omori, Kyoto (JP); Takashi Ito, Kyoto (JP); Nobuhiko Nishide, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 211 days.

(21) Appl. No.: 15/980,385

(22) Filed: May 15, 2018

(65) Prior Publication Data

US 2018/0337103 A1 Nov. 22, 2018

(30) Foreign Application Priority Data

May 17, 2017 (JP) .............................. JP2017-097969

(51) Int. Cl.
  *H01L 21/66* (2006.01)
  *H01L 21/67* (2006.01)
  (Continued)

(52) U.S. Cl.
  CPC ............ *H01L 22/26* (2013.01); *H01L 21/324* (2013.01); *H01L 21/67017* (2013.01);
  (Continued)

(58) Field of Classification Search
  CPC ............... H01L 22/26; H01L 21/67017; H01L 21/67115; H01L 21/324
  (Continued)

(56) References Cited

U.S. PATENT DOCUMENTS 5,810,928 A * 9/1998 Harada .................. C23C 16/52
                                                                118/689
2003/0000471 A1   1/2003 Yoon et al.
(Continued)

FOREIGN PATENT DOCUMENTS

CN        103590879 A    2/2014
JP        08-153685 A    6/1996
(Continued)

OTHER PUBLICATIONS

Taiwanese Office Action issued in corresponding Taiwanese Patent Application No. 107113986, dated Aug. 29, 2019, with English translation of the Japanese translation of the Taiwanese Office Action.

(Continued)

*Primary Examiner* — Thien S Tran
(74) *Attorney, Agent, or Firm* — McDermott Will & Emery LLP (57) ABSTRACT

A first mass flow controller is provided in an inert gas pipe for feeding nitrogen gas. A second mass flow controller is provided in a reactive gas pipe for feeding ammonia. A joint pipe communicatively connects a joint portion of the inert gas pipe and the reactive gas pipe to a chamber for treating a semiconductor wafer. The joint pipe is provided with a mass flowmeter. A detector detects gas leakage by comparing a total value of flow rates of nitrogen controlled by the first mass flow controller and of ammonia controlled by the second mass flow controller with a measurement value of a flow rate of a treatment gas, obtained by the mass flowmeter.

6 Claims, 8 Drawing Sheets

(51) Int. Cl.
*H01L 21/324* (2006.01)
*H01L 21/687* (2006.01)

(52) U.S. Cl.
CPC .. *H01L 21/67115* (2013.01); *H01L 21/67248* (2013.01); *H01L 21/67253* (2013.01); *H01L 21/67288* (2013.01); *H01L 21/6875* (2013.01); *H01L 21/68707* (2013.01)

(58) Field of Classification Search
USPC .......................... 219/385; 438/715, 761, 795
See application file for complete search history.

(56) References Cited

U.S. PATENT DOCUMENTS

| | | | |
|---|---|---|---|
| 2008/0000551 A1* | 1/2008 | Sato .................... | H01L 21/3144 148/222 |
| 2012/0006487 A1 | 1/2012 | Kikuchi et al. | |
| 2013/0203269 A1 | 8/2013 | Yokouchi | |
| 2014/0261703 A1* | 9/2014 | Raj .................... | F16K 37/0091 137/1 |
| 2016/0195333 A1 | 7/2016 | Kawarazaki | |

FOREIGN PATENT DOCUMENTS

| | | |
|---|---|---|
| JP | 09-055369 A | 2/1997 |
| JP | 2000-306853 A | 11/2000 |
| JP | 2005-328063 A | 11/2005 |
| JP | 2012-104808 A | 5/2012 |
| JP | 2014-183247 A | 9/2014 |
| JP | 2016-127194 A | 7/2016 |
| KR | 10-2012-0001788 A | 1/2012 |

OTHER PUBLICATIONS

Korean Notification of Reason for Refusal issued in corresponding Korean Patent Application No. 10-2018-0055363, dated Sep. 5, 2019, with English translation.

Korean Office Action issued in corresponding Korean Patent Application No. 10-2018-0055363, dated Feb. 24, 2020, with English translation.

Japanese Notice of Reasons for Refusal issued in corresponding Japanese Patent Application No. 2017-097969, dated Nov. 24, 2020, with English translation.

* cited by examiner

HEAT TREATMENT APPARATUS OF LIGHT IRRADIATION TYPE AND HEAT TREATMENT METHOD

BACKGROUND OF THE INVENTION

Field of the Invention

The present invention relates to a heat treatment apparatus and a heat treatment method for irradiating a thin-plated precision electronic substrate (hereinafter referred to as simply "substrate") such as a semiconductor wafer with light to heat the substrate.

Description of the Background Art

In a manufacturing process of semiconductor devices, flash lamp annealing (FLA) for heating a semiconductor wafer for an extremely short time has been paid attention. The flash lamp annealing is a heat treatment technology for irradiating a surface of a semiconductor wafer with a flash of light by using a xenon flash lamp (hereinafter when referred to as simply a "flash lamp", it means a xenon flash lamp) to increase temperature of only the surface of the semiconductor wafer in an extremely short time (milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

This kind of flash lamp annealing is used for treatment requiring heating for an extremely short time, such as typically activation of impurities implanted into a semiconductor wafer. When a flash lamp irradiates a surface of a semiconductor wafer, into which impurities are implanted by an ion implantation method, with a flash of light, temperature of the surface of the semiconductor wafer can be increased to an activation temperature for only an extremely short time, whereby only impurity activation can be performed without diffusing the impurities deeply.

It is also studied to apply flash lamp annealing to post deposition anneal (PDA) of a high dielectric constant gate insulator film formed on a field effect transistor (FET). The high dielectric constant gate insulator film is developed as a new stack structure of a field effect transistor together with a metal gate electrode using a metal for the gate electrode to solve a problem that leakage current increases with progress of thinning of a gate insulating film.

US2016/0195333 discloses that a high dielectric constant gate insulator film formed by interposing an interface layer film on a silicon substrate is irradiated with a flash of light from a flash lamp to perform heat treatment for a very short time. US2016/0195333 also discloses that an ammonia atmosphere is formed by supplying a mixed gas of ammonia and nitrogen into a chamber to be subjected to heat treatment, and flash heating of a high dielectric constant gate insulator film is performed in the ammonia atmosphere to apply nitriding treatment to the high dielectric constant gate insulator film.

In the heat treatment apparatus disclosed in US2016/0195333, a flow regulating valve is provided for each of pipes for feeding ammonia to the chamber and for feeding nitrogen thereto, and a flow rate of each of ammonia and nitrogen is individually adjusted to form an atmosphere having a desired ammonia concentration in the chamber.

Unfortunately, when the flow rate of each of ammonia and nitrogen is only individually adjusted by the flow regulating valve, gas leakage cannot be detected even if a gas pipe is disconnected or a joint loosens to cause gas to leak. In particular, leakage of nitrogen gas increases ammonia concentration in the chamber to more than a limit to cause a serious problem in heat treatment of the high dielectric constant gate insulator film.

SUMMARY

The present invention is directed to a heat treatment apparatus for irradiating a substrate with light to heat the substrate.

According to one aspect of the present invention, a heat treatment apparatus includes: a chamber for accommodating a substrate; a light irradiator for irradiating the substrate accommodated in the chamber with light; and a gas supply unit for supplying a treatment gas into the chamber, the gas supply unit including the following: an inert gas pipe for feeding an inert gas; a reactive gas pipe for feeding a reactive gas; a joint pipe for communicatively connecting a joint portion of the inert gas pipe and the reactive gas pipe to the chamber to feed the treatment gas in which the inert gas and the reactive gas are mixed to the chamber; a first flow rate control unit that controls a flow rate of the inert gas flowing through the inert gas pipe; a second flow rate control unit that controls a flow rate of the reactive gas flowing through the reactive gas pipe; and a flow rate measurement unit that measures a flow rate of the treatment gas flowing through the joint pipe.

Gas leakage from the gas pipe can be reliably detected by measuring a flow rate of the treatment gas mixed when the inert gas and the reactive gas merge.

Preferably, when a difference between a total value of a flow rate of the inert gas controlled by the first flow control unit and a flow rate of the reactive gas controlled by the second flow control unit, and a flow rate of the treatment gas, acquired by the flow rate measurement unit, is more than the flow rate of the reactive gas controlled by the second flow control unit, it is determined that there is an anomaly in the gas supply unit.

It is possible to reliably detect gas leakage of the inert gas.

The present invention is also directed to a heat treatment method for irradiating a substrate with light to heat the substrate.

According to one aspect of the present invention, a heat treatment method includes the steps of: (a) supplying a treatment gas to a chamber accommodating a substrate; and (b) irradiating the substrate accommodated in the chamber with light, wherein the step (a) includes the following steps of: (a-1) controlling a flow rate of an inert gas flowing through an inert gas pipe for feeding the inert gas; (a-2) controlling a flow rate of a reactive gas flowing through a reactive gas pipe for feeding the reactive gas; and (a-3) measuring a flow rate of a treatment gas in which the inert gas and the reactive gas are mixed, the treatment gas flowing through a joint pipe for feeding the treatment gas to the chamber, the joint pipe communicatively connecting a joint portion of the inert gas pipe and the reactive gas pipe to the chamber.

Gas leakage from the gas pipe can be reliably detected by measuring a flow rate of the treatment gas mixed when the inert gas and the reactive gas merge.

Preferably, when a difference between a total value of a flow rate of the inert gas controlled in the step (a-1) and a flow rate of the reactive gas controlled in the step (a-2), and a measurement value of a flow rate of the treatment gas, acquired in the step (a-3), is more than the flow rate of the reactive gas controlled in the step (a-2), it is determined that there is an anomaly.

It is possible to reliably detect gas leakage of the inert gas.

It is therefore an object of the present invention to reliably detect gas leakage from a gas pipe.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described in detail with reference to the drawings.

Figure 1:
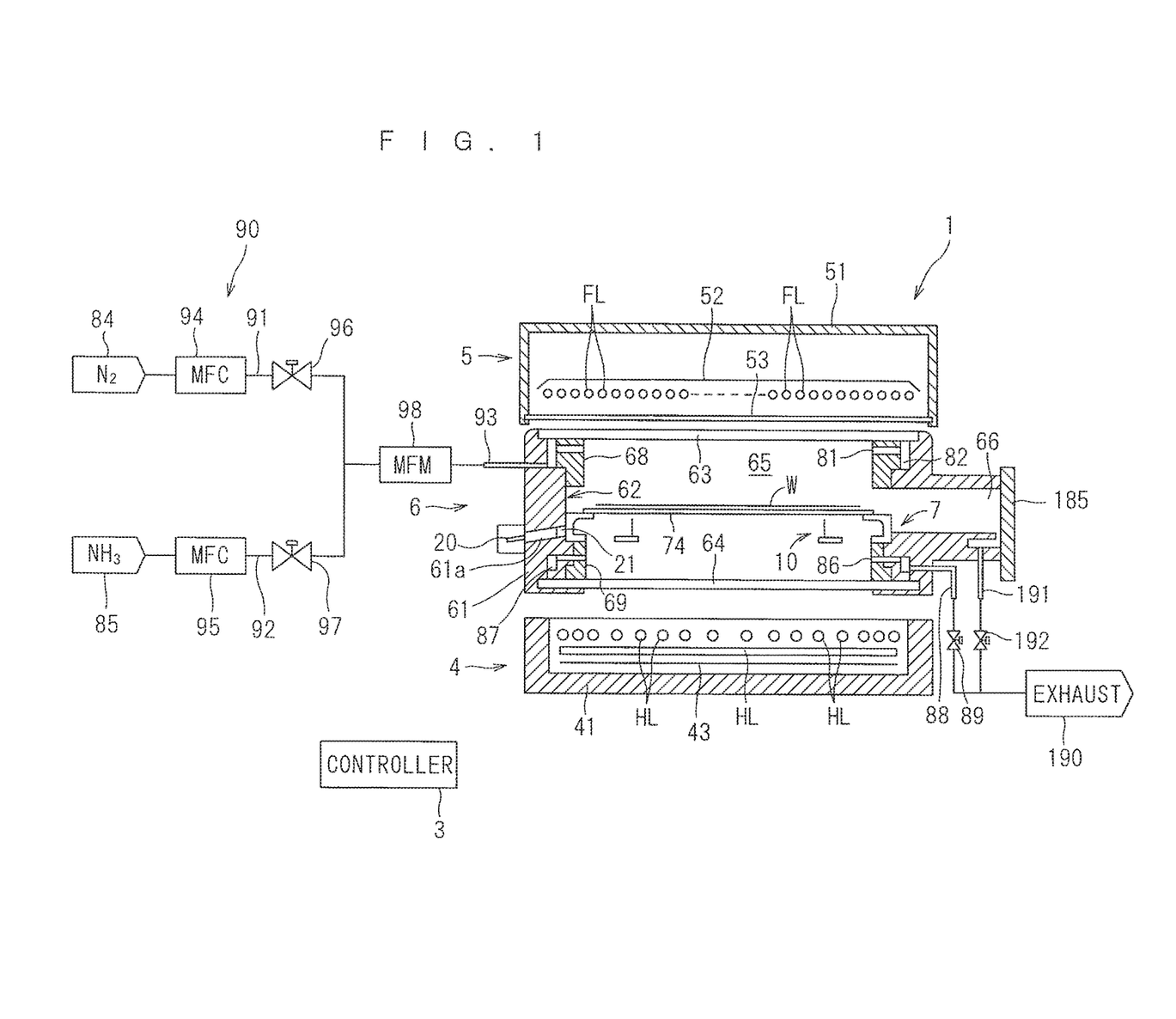
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W before being transported into the heat treatment apparatus 1 is provided with a high dielectric constant gate insulator film (High-k film), and post deposition anneal (PDA) of the high dielectric constant gate insulator film is performed by heat treatment by the heat treatment apparatus 1. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 includes a gas supply unit 90 that supplies a treatment gas into the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a portion of an outer wall surface of the chamber side portion 61 where the through hole 61a is provided. The through hole 61a is a cylindrical hole for directing infrared radiation, emitted from the lower surface of a semiconductor wafer W held by a susceptor 74 described below, therethrough to the radiation thermometer 20. The through hole 61a is inclined with respect to a horizontal direction so that the longitudinal axis (axis extending in a direction in which the through hole 61a extend through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a, facing the heat treatment space 65. The radiation thermometer 20 receives infrared light emitted from the lower surface of the semiconductor wafer W through the transparent window 21 and measures temperature of the semiconductor wafer W from intensity of the infrared light.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a joint pipe 93 of the gas supply unit 90 through a buffer space 82 provided in the form of an annular ring inside the side wall of the chamber 6. The configuration of the gas supply unit 90 will be described in detail later. The treatment gas is supplied from the joint pipe 93 to the chamber 6. The treatment gas fed from the joint pipe 93 flows in a spreading manner within the buffer space 82 that is lower in fluid resistance than the gas supply opening 81, and is supplied into the heat treatment space 65 through the gas supply opening 81. In the present preferred embodiment, a mixed gas obtained by mixing nitrogen and ammonia as a treatment gas is supplied into the chamber 6.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
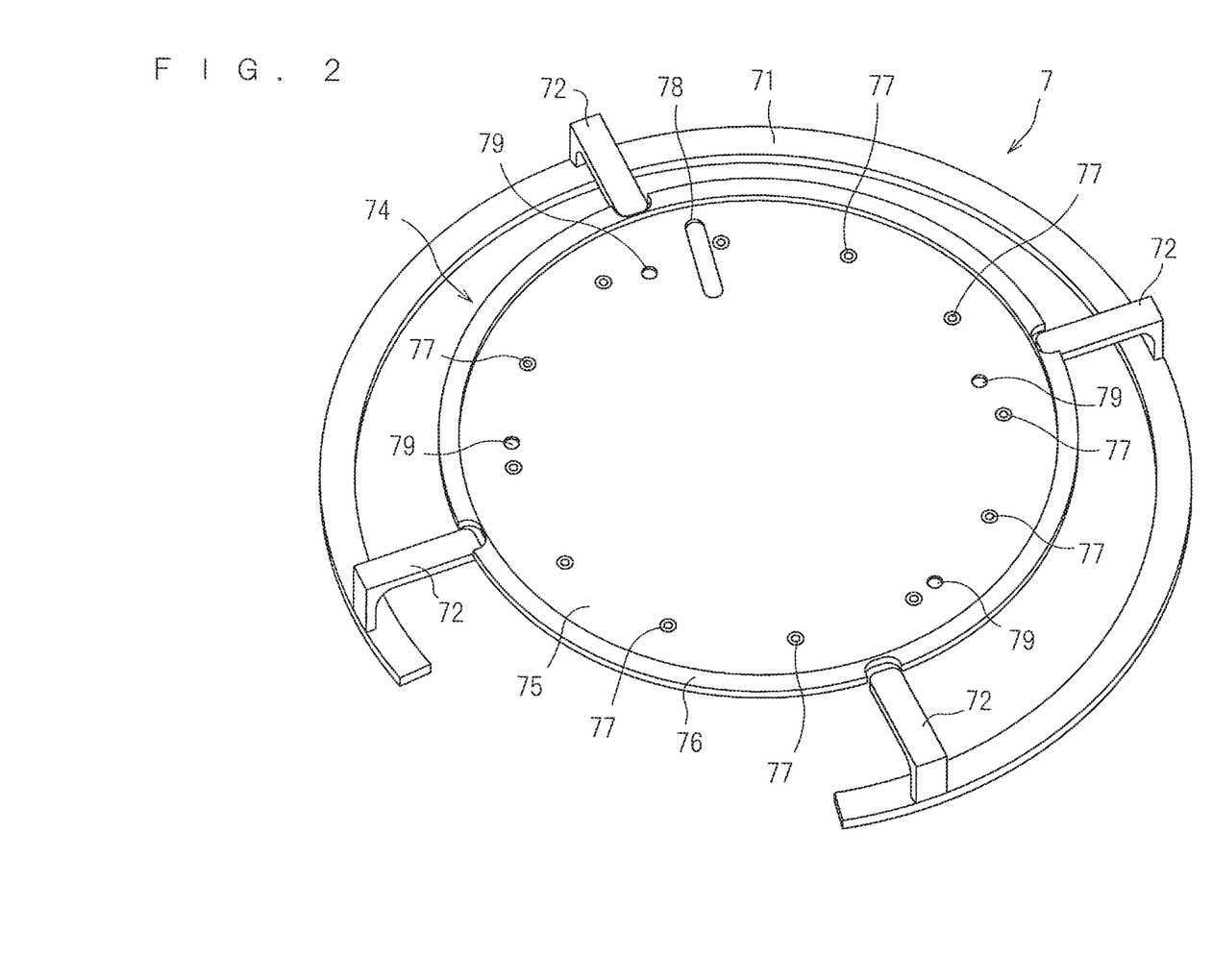
FIG. 2 is a perspective view showing an entire external appearance of a holder.

FIG. 2 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
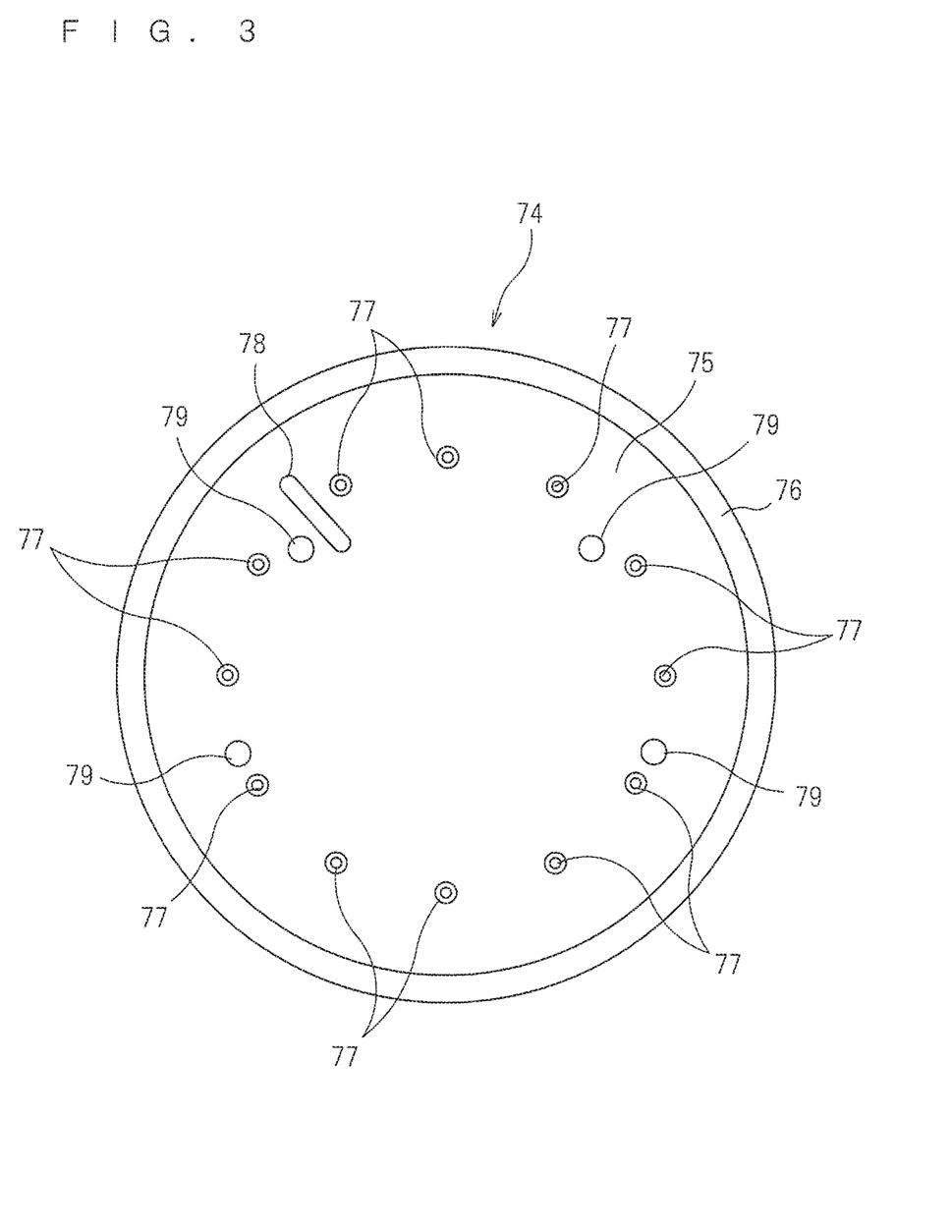
FIG. 3 is a plan view of a susceptor.
Figure 4:
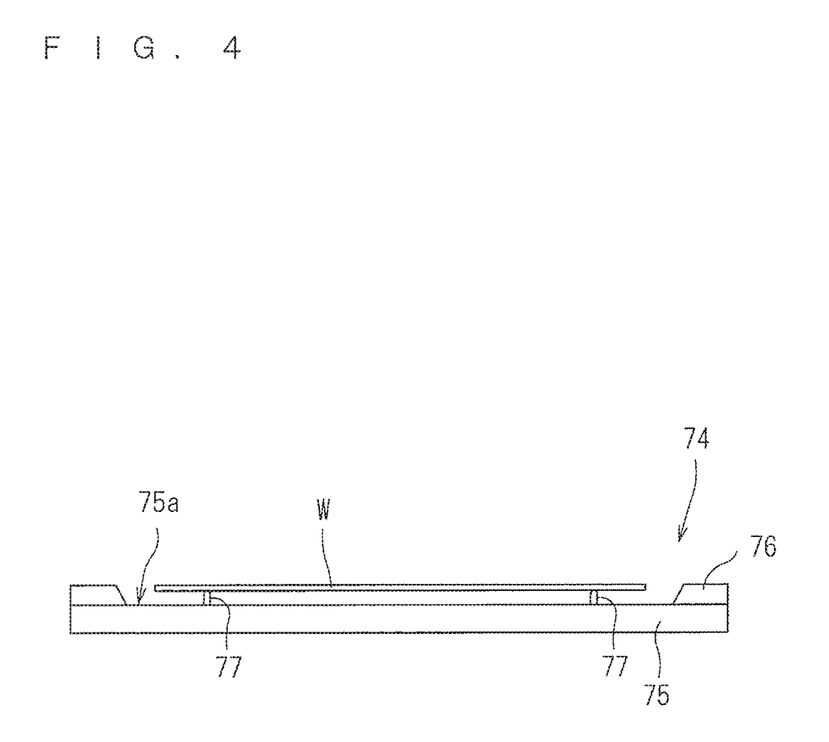
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal plane.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
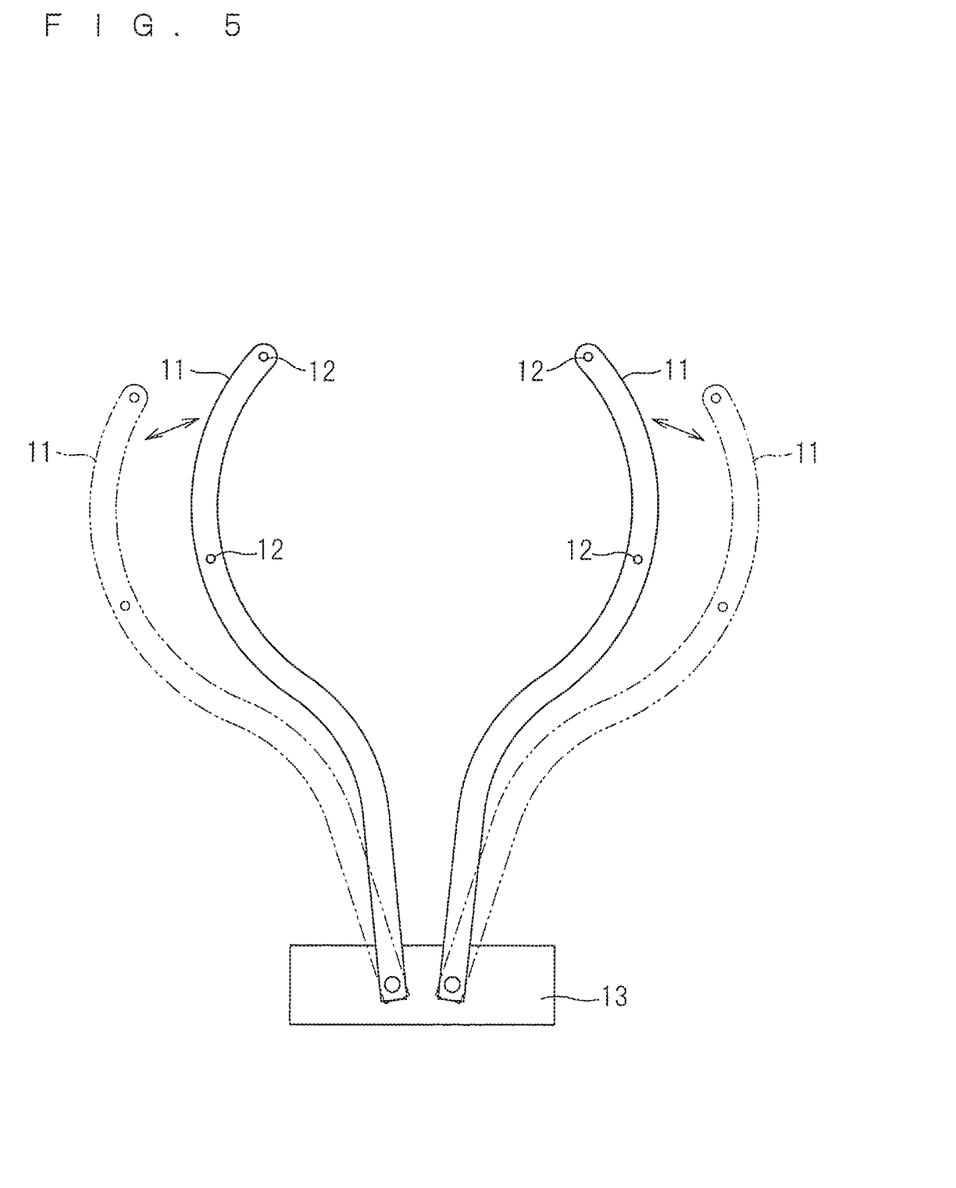
FIG. 5 is a plan view of a transfer mechanism.
Figure 6:
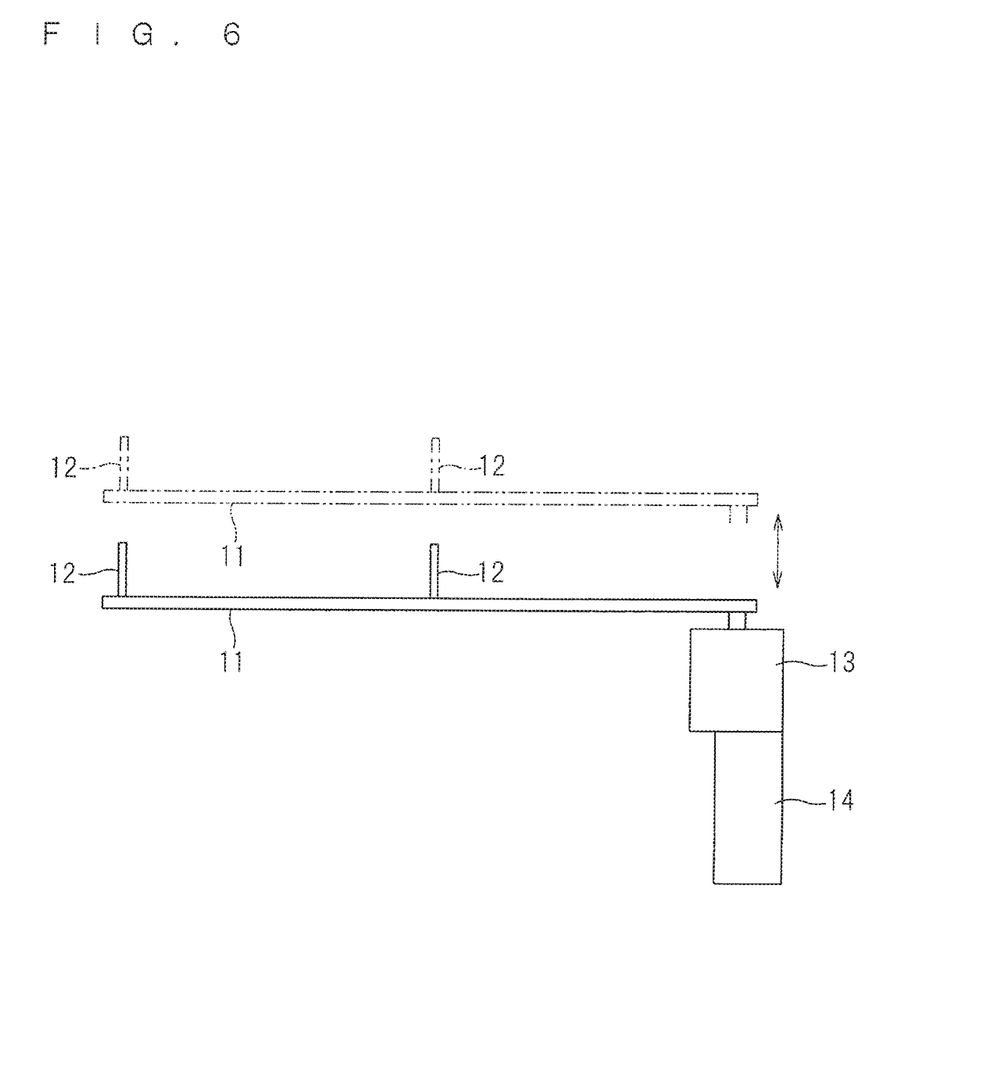
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. The area where the plurality of flash lamps FL is arranged is larger than the plane size of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
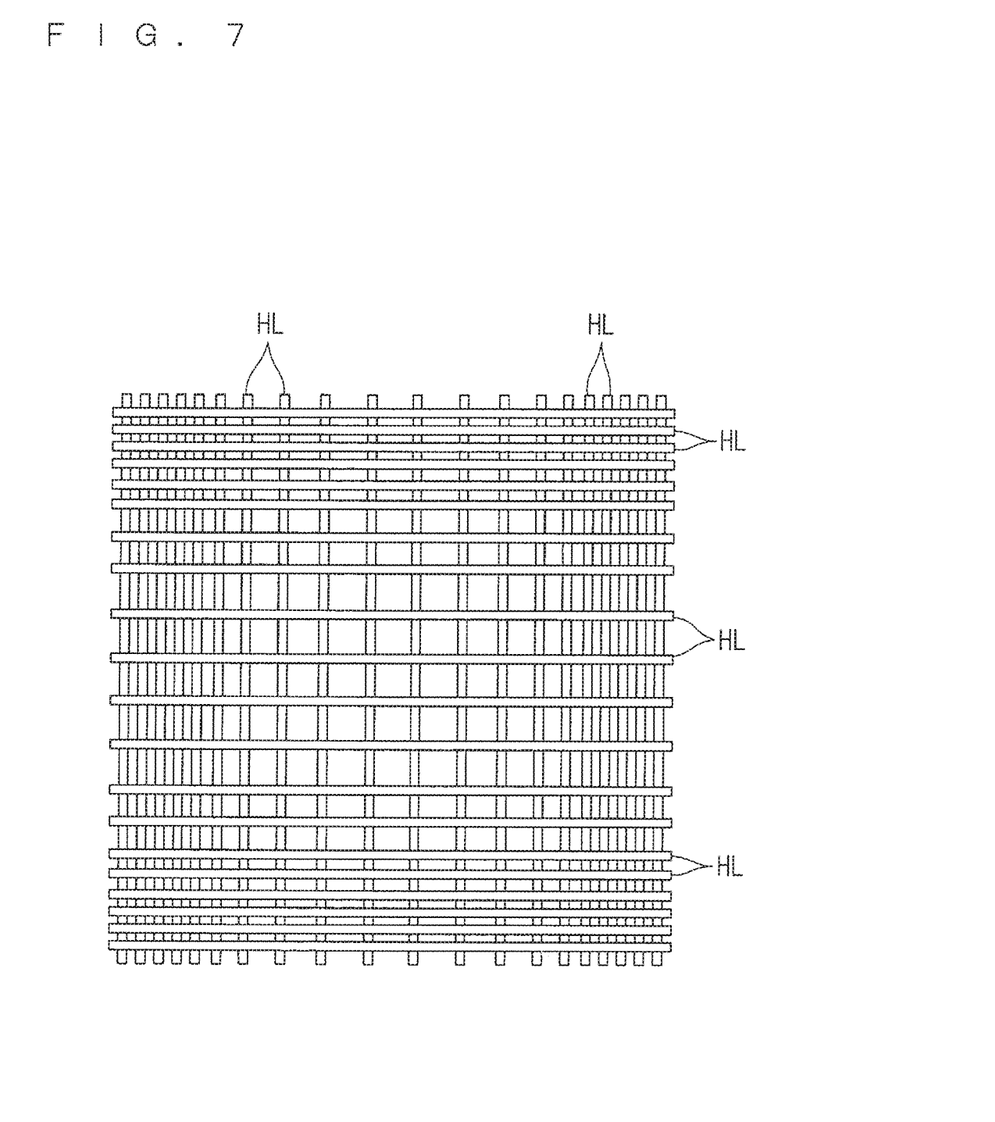
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
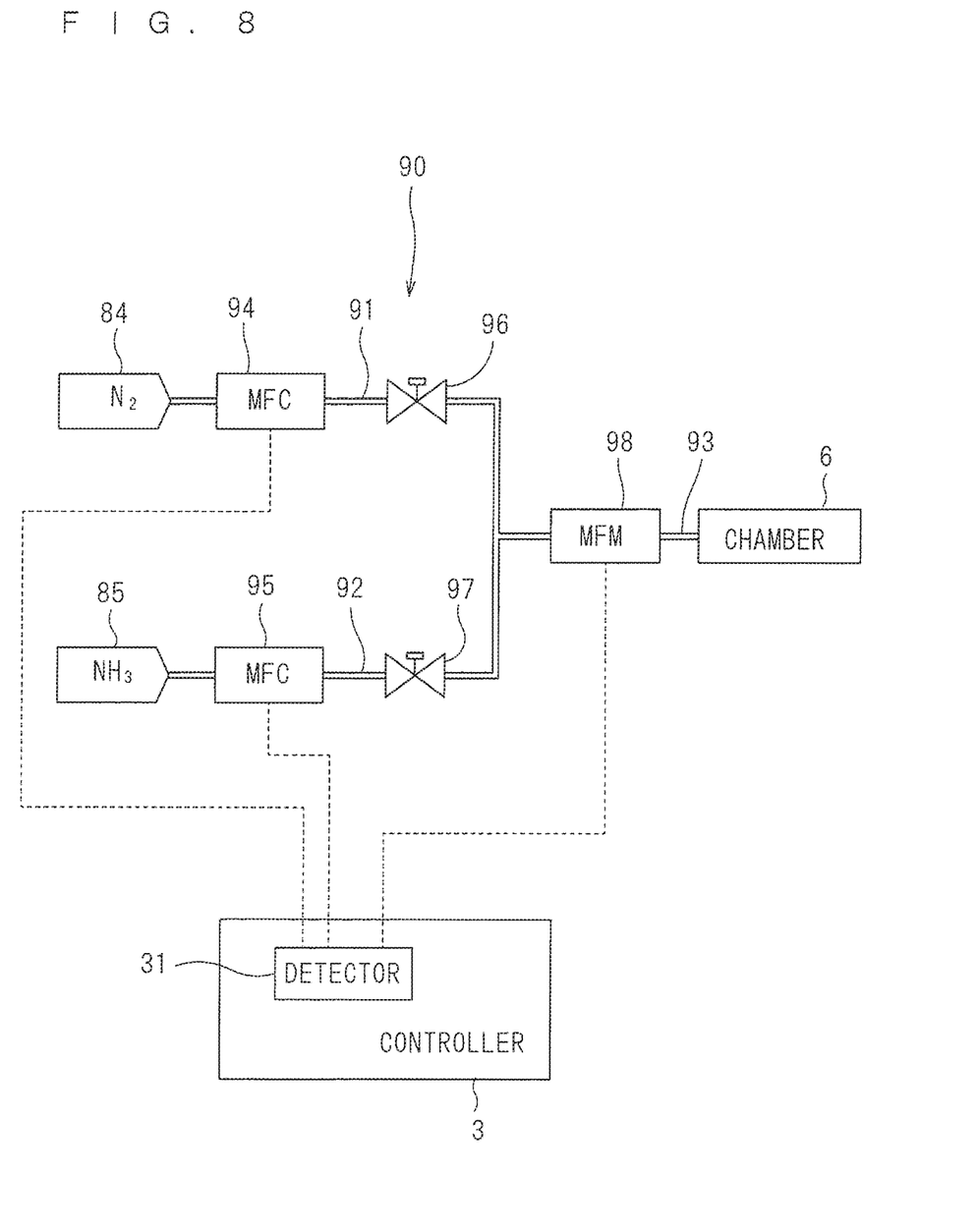
FIG. 8 is a diagram showing a configuration of a gas supply unit.

FIG. 8 is a diagram showing a configuration of the gas supply unit 90. The gas supply unit 90 includes an inert gas pipe 91 for feeding an inert gas, a reactive gas pipe 92 for feeding a reactive gas, and a joint pipe 93 for feeding a treatment gas in which both of these gases are mixed.

The inert gas pipe 91 is connected at its base end to an inert gas supply source 84. The inert gas pipe 91 has a distal end merging into the reactive gas pipe 92. At some midpoint in the inert gas pipe 91, a first mass flow controller 94 and a first valve 96 are provided. When the first valve 96 is opened, an inert gas is fed from the inert gas supply source 84 to the inert gas pipe 91. In the present preferred embodiment, nitrogen ($N_2$) is fed as an inert gas to the inert gas pipe 91.

The first mass flow controller 94 measures a mass flow rate of the inert gas flowing through the inert gas pipe 91, and controls a flow rate of the inert gas flowing through the inert gas pipe 91 on the basis of an instruction from the controller 3. That is, the first mass flow controller 94 is a mass flowmeter with a flow rate control function.

Meanwhile, the reactive gas pipe 92 is connected at its base end to a reactive gas supply source 85. The reactive gas pipe 92 has a distal end merging into the inert gas pipe 91. At some midpoint in the reactive gas pipe 92, a second mass flow controller 95 and a second valve 97 are provided. When the second valve 97 is opened, a reactive gas is fed from the reactive gas supply source 85 to the reactive gas pipe 92. In the present preferred embodiment, ammonia ($NH_3$) is fed as a reactive gas to the reactive gas pipe 92.

The second mass flow controller 95 measures a mass flow rate of the reactive gas flowing through the reactive gas pipe 92, and controls a flow rate of the reactive gas flowing through the reactive gas pipe 92 on the basis of an instruction from the controller 3. That is, the second mass flow controller 95 is also a mass flowmeter with a flow rate control function.

The joint pipe 93 communicatively connects a joint portion of the inert gas pipe 91 and the reactive gas pipe 92 to the chamber 6. The joint pipe 93 is provided so that a mixed gas obtained by mixing nitrogen fed from the inert gas pipe 91 and ammonia fed from the reactive gas pipe 92, as a treatment gas, is fed to the chamber 6.

At some midpoint in the joint pipe 93, a mass flowmeter 98 is provided. The mass flowmeter 98 measures a mass flow rate of the treatment gas flowing through the joint pipe 93.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

As indicated by a dotted line in FIG. 8, the controller 3 is electrically connected to the first mass flow controller 94, the second mass flow controller 95, and the mass flow meter 98, to perform transmission and reception of electric signals for them. The controller 3 includes a detector 31 being a function processing unit that serves when the CPU of the controller 3 executes a predetermined processing program. Processing content of the detector 31 will be described later.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. Here, the semiconductor wafer W to be treated is a semiconductor substrate on which a high dielectric constant gate insulator film is formed. The heat treatment apparatus 1 performs flash light irradiation heat treatment (annealing) to apply post deposition anneal to the high dielectric constant gate insulator film. The procedure for the treatment in the heat treatment apparatus 1 which will be described below proceeds under the control of the controller 3 over the operating mechanisms of the heat treatment apparatus 1.

First, the gate valve 185 is opened to open the transport opening 66. A transport robot outside the heat treatment apparatus 1 transports a semiconductor wafer W through the transport opening 66 into the heat treatment space 65 of the chamber 6. At this time, the first valve 96 may be opened to supply nitrogen gas into the chamber 6 so that the nitrogen gas flows out from the transport opening 66 to minimize entrainment of the external atmosphere followed by loading of the semiconductor wafer W.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 such that its front surface provided with the high dielectric constant gate insulator film faces upward. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the transport opening 66 is closed by the gate valve 185 to set the heat treatment space 65 as a hermetically enclosed space, atmosphere in the chamber 6 is adjusted. Specifically, when the first valve 96 is opened, nitrogen fed from the inert gas pipe 91 and ammonia fed from the reactive gas pipe 92 by opening the second valve 97 merge in the joint pipe 93 and mix with each other. Then, the mixed gas as a treatment gas in which the ammonia is mixed with the nitrogen as a dilution gas is supplied to the heat treatment space 65 in the chamber 6 through the joint pipe 93. When the valve 89 for exhaust is opened, the gas in the heat treatment space 65 is exhausted through the gas exhaust opening 86. In addition, when the valve 192 is opened, the gas in the heat treatment space 65 is exhausted also through the transport opening 66. This causes atmosphere replacement in the heat treatment space 65 to proceed to form an ammonia atmosphere around the semiconductor wafer W held by the holding unit 7. A concentration of ammonia in the ammonia atmosphere (or a mixing ratio of ammonia and nitrogen gas) is adjusted to a predetermined value by controlling a flow rate of each of nitrogen and ammonia with the first mass flow controller 94 and the second mass flow controller 95 under control of the controller 3. The ammonia concentration in the ammonia atmosphere is not particularly limited, and can be set to an appropriate value.

After the semiconductor wafer W is held in a horizontal attitude from below by the susceptor 74 of the holder 7 and atmosphere in the heat treatment space 65 in the chamber 6 is replaced with an ammonia atmosphere, the 40 halogen lamps HL in the halogen heating part 4 turn on simultaneously to start preheating (or assist heating). Halogen light emitted from the halogen lamps HL is transmitted through the lower chamber window 64 and the susceptor 74 both made of quartz, and impinges upon the back surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The radiation thermometer 20 measures temperature of the semiconductor wafer W when the halogen lamps HL perform the preheating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 is 300° C. or more and 600° C. or less, and is 450° C. in the present preferred embodiment.

After the temperature of the semiconductor wafer W reaches the preheating temperature T1, the controller 3 maintains the temperature of the semiconductor wafer W at the preheating temperature T1 for a short time. Specifically, when the temperature of the semiconductor wafer W measured with the radiation thermometer 20 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W subjected to the flash heating by the flash irradiation from the flash lamps FL momentarily increases to a treatment temperature T2, and then decreases rapidly. The treatment temperature T2 being the maximum temperature (peak temperature) to which the flash irradiation can increase the temperature of the front surface of the semiconductor wafer W is 600° C. or more and 1200° C. or less, and is 1000° C. in the present preferred embodiment. When the temperature of the front surface of the semiconductor wafer W increases to the treatment temperature T2 in the ammonia atmosphere, the post deposition anneal of the high dielectric constant gate insulator film is performed to promote nitridation thereof. Irradiation time from the flash lamps FL is a short time of one second or less, so that time required for the temperature of the front surface of the semiconductor wafer W to increase from the preheating temperature T1 to the treatment temperature T2 is also extremely short time of one second or less.

After a predetermined time period has elapsed since the completion of the flash heating treatment, the halogen lamps HL turn off. This causes the temperature of the semiconductor wafer W to decrease rapidly from the preheating temperature T1. In addition, only the second valve 97 is closed to supply only nitrogen to the chamber 6, so that atmosphere in the heat treatment space 65 is replaced with a nitrogen atmosphere. The radiation thermometer 20 measures the temperature of the semiconductor wafer W decreasing in temperature, and a result of measurement is transmitted to the controller 3. The controller 3 monitors whether the temperature of the semiconductor wafer W is decreased to a predetermined temperature on the basis of the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the heat treatment apparatus 1 of the present preferred embodiment, a mixed gas obtained by mixing nitrogen fed from the inert gas pipe 91 and ammonia fed from the reactive gas pipe 92 in the joint pipe 93 is used as a treatment gas, and is supplied to the heat treatment space 65 in the chamber 6 to form an ammonia atmosphere in the chamber 6. Then, the first mass flow controller 94 and the second mass flow controller 95 adjust flow rates of the nitrogen and the ammonia to set values, respectively, to adjust an ammonia concentration in the chamber 6. The controller 3 gives the set values of the flow rates of the nitrogen and the ammonia to the first mass flow controller 94 and the second mass flow controller 95, respectively. The first mass flow controller 94 and the second mass flow controller 95 adjust the flow rates of the nitrogen and the ammonia to the set values instructed from the controller 3, respectively. For example, in the present preferred embodiment, the first mass flow controller 94 adjusts the flow rate of the nitrogen fed from the inert gas pipe 91 to 100 l/min according to the set value instructed from the controller 3, and the second mass flow controller 95 adjusts the flow rate of the ammonia fed from the reactive gas pipe 92 to 5.5 l/min. Thus, the mixed gas of the nitrogen and the ammonia, flowing through the joint pipe 93, has a total flow rate of 105.5 l/min.

Here, if a joint between the inert gas pipe 91 and/or the reactive gas pipe 92, and the joint pipe 93 loosens, or the pipes are disconnected, gas leaks to cause a total flow rate of the treatment gas flowing through the joint pipe 93 to be less than 105.5 l/min. Further, the ammonia concentration in the ammonia atmosphere formed in the chamber 6 varies from a target value. Particularly, leakage of nitrogen gas causes the ammonia concentration in the chamber 6 to increase to more than the target value. This causes a serious trouble in the post deposition anneal of the high dielectric constant gate insulator film, so that the leakage of nitrogen gas must be reliably detected.

Thus, in the present preferred embodiment, there is provided the mass flowmeter 98 for measuring a flow rate of the treatment gas flowing through the joint pipe 93, and the detector 31 detects an anomaly in the gas supply unit 90. The anomaly in the gas supply unit 90 includes loosening of a piping joint of the inert gas pipe 91, the reactive gas pipe 92, or the joint pipe 93, and disconnection of the pipes. Specifically, the detector 31 detects an anomaly in the gas supply unit 90 by comparing a total value of flow rates of nitrogen controlled by the first mass flow controller 94 and of ammonia controlled by the second mass flow controller 95 with a measurement value of a flow rate of the treatment gas obtained by the mass flowmeter 98. In the above example, the total value of the flow rate of nitrogen (100 l/min) controlled by the first mass flow controller 94 and the flow rate (5.5 l/min) of ammonia controlled by the second mass flow controller 95 is 105.5 l/min. The detector 31 compares the total value of 105.5 l/min with a measurement value of the mass flowmeter 98. If there is no gas leakage, the flow rate of the treatment gas measured by the mass flow meter 98 is 105.5 l/min, and the above total value and the measurement value of the mass flowmeter 98 coincide with each other. If there is gas leakage, the flow rate of the treatment gas measured by the mass flowmeter 98 is less than 105.5 l/min, and the total value and the measurement value of the mass flowmeter 98 vary from each other.

In the present preferred embodiment, the detector 31 determines that there is an anomaly in the gas supply unit 90 when a difference between the above total value and the measurement value of the mass flowmeter 98 is more than the flow rate (5.5 l/min) of ammonia controlled by the second mass flow controller 95. That is, when the measurement value of the mass flowmeter 98 is less than 100 l/min, the detector 31 determines that there is an anomaly in the gas supply unit 90. When ammonia gas leaks, a difference between the above total value and the measurement value of the mass flowmeter 98 is to be equal to or less than the flow rate of ammonia controlled by the second mass flow controller 95. Thus, the fact that the difference between the total value and the measurement value of the mass flowmeter 98 is more than the flow rate of ammonia controlled by the second mass flow controller 95 indicates that nitrogen gas leaks. Accordingly, the detector 31 determines that there is an anomaly in the gas supply unit 90 when the difference between the total value and the measurement value of the mass flowmeter 98 is more than the flow rate of ammonia controlled by the second mass flow controller 95.

When the detector 31 determines that there is an anomaly in the gas supply unit 90, the controller 3 closes the first valve 96 and the second valve 97 to stop supplying gas from the gas supply unit 90, and interrupts treatment of the semiconductor wafer W in the heat treatment apparatus 1. The controller 3 also may issue an alarm of gas leakage. This enables treatment failure of the semiconductor wafer W to be prevented.

As described above, in the present preferred embodiment, the mass flowmeter 98 is provided in the joint pipe 93, and a total value of a flow rate of nitrogen controlled by the first mass flow controller 94 and a flow rate of ammonia controlled by the second mass flow controller 95 is compared with a measurement value of a flow rate of the treatment gas obtained by the mass flowmeter 98 to enable gas leakage from the gas pipe to be reliably detected. It is also conceivable that the above total value does not coincide with the measurement value of the mass flowmeter 98 due to inaccurate flow rate control of the first mass flow controller 94 and/or the second mass flow controller 95. Thus, the first mass flow controller 94 measures a flow rate of nitrogen flowing through the inert gas pipe 91 to check whether it coincides with the flow rate to be controlled, and the second mass flow controller 95 measures a flow rate of ammonia flowing through the reactive gas pipe 92 to check whether it coincides with the flow rate to be controlled. As a result, an anomaly in the flow rate control of the first mass flow controller 94 and the second mass flow controller 95 is to be detected. That is, the first mass flow controller 94 and the second mass flow controller 95, and the mass flow meter 98 double check an anomaly of the gas supply unit 90.

While the preferred embodiment according to the present invention has been described hereinabove, various modifications of the present invention in addition to those described above may be made without departing from the scope and spirit of the invention. For example, the detector 31 may determine that there is an anomaly when the total value of the flow rate of nitrogen controlled by the first mass flow controller 94 and the flow rate of ammonia controlled by the second mass flow controller 95 does not coincide with the measurement value of the flow rate of the treatment gas obtained by the mass flow meter 98. The fact that the total value does not coincide with the measurement value indicates that there is leakage due to disconnection of pipes or loosening of a joint in any one of the inert gas pipe 91, the reactive gas pipe 92, and the joint pipe 93. Thus, the detector 31 may determine that there is an anomaly in the gas supply unit 90 when the total value does not coincide with the measurement value. In this case, even leakage of ammonia gas is determined as an anomaly.

The detector 31 also may determine that there is an anomaly when a difference between the total value of the flow rate of nitrogen controlled by the first mass flow controller 94 and the flow rate of ammonia controlled by the second mass flow controller 95, and the measurement value of the flow rate of the treatment gas obtained by the mass flow meter 98, is a predetermined threshold value or more. It is preferable that the threshold value is determined on the basis of a measurement error and a machine difference. This enables an anomaly to be determined in consideration of a measurement error and a machine difference.

The inert gas supplied from the inert gas pipe 91 is not limited to nitrogen, and may be any gas selected from the group consisting of nitrogen, argon (Ar), and helium (He). Likewise, the reactive gas fed from the reactive gas pipe 92 is not limited to ammonia, and may be any gas selected from the group consisting of ammonia, hydrogen ($H_2$), nitrous oxide ($N_2O$), nitrogen trifluoride ($NF_3$), and oxygen ($O_2$). Hydrogen is a combustible gas, nitrous oxide, nitrogen trifluoride and oxygen are combustion-supporting gases (combustion-assisting gases).

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In each of the above preferred embodiments, although the filament-type halogen lamps HL each are used as a continuous lighting lamp that emits light continuously for not less than one second to preheat a semiconductor wafer W, the present invention is not limited to this, and an arc lamp of a discharge type (e.g., xenon arc lamp) may be used as a continuous lighting lamp in place of the halogen lamp HL to perform preheating.

A substrate to be treated by the heat treatment apparatus according to the present invention is not limited to a semiconductor wafer, and may be a glass substrate to be used for a flat panel display such as a liquid crystal display device, and a substrate for a solar cell.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a substrate with light to heat the substrate, the heat treatment apparatus comprising:
   a chamber for accommodating a substrate;
   a lamp for irradiating said substrate accommodated in said chamber with light;
   a gas supply unit for supplying a treatment gas into said chamber, said gas supply unit including:
      an inert gas pipe for feeding an inert gas;
      a reactive gas pipe for feeding a reactive gas;
      a joint pipe for communicatively connecting a joint portion of said inert gas pipe and said reactive gas pipe to said chamber to feed said treatment gas in which said inert gas and said reactive gas are mixed to said chamber;
      a first mass flow controller that controls a flow rate of said inert gas flowing through said inert gas pipe;
      a second mass flow controller that controls a flow rate of said reactive gas flowing through said reactive gas pipe; and
      a mass flowmeter that measures a flow rate of said treatment gas flowing through said joint pipe; and
   a detector for detecting an anomaly in said gas supply unit by comparing a total value of a flow rate of said inert gas controlled by said first mass flow controller and a flow rate of said reactive gas controlled by said second mass flow controller with a measurement value of a flow rate of said treatment gas, acquired by said mass flowmeter,
   wherein the detector determines that there is an inert gas leakage when a difference between said total value and said measurement value is more than the flow rate of said reactive gas controlled by said second mass flow controller.

2. The heat treatment apparatus according to claim 1, wherein
   said inert gas is any gas selected from a group consisting of nitrogen, argon, and helium, and
   said reactive gas is any gas selected from a group consisting of ammonia, hydrogen, nitrous oxide, nitrogen trifluoride and oxygen.

3. The heat treatment apparatus according to claim 1, wherein
   said lamp includes a flash lamp for irradiating said substrate with a flash of light.

4. A heat treatment method for irradiating a substrate with light to heat the substrate, the heat treatment method comprising the steps of:
   (a) supplying a treatment gas to a chamber accommodating a substrate;
   (b) irradiating said substrate accommodated in said chamber with light, said step (a) including the steps of:
      (a-1) controlling a flow rate of an inert gas flowing through an inert gas pipe for feeding said inert gas;
      (a-2) controlling a flow rate of a reactive gas flowing through a reactive gas pipe for feeding said reactive gas; and
      (a-3) measuring a flow rate of a treatment gas in which said inert gas and said reactive gas are mixed, said treatment gas flowing through a joint pipe for feeding said treatment gas to said chamber, said joint pipe communicatively connecting a joint portion of said inert gas pipe and said reactive gas pipe to said chamber;
   (c) detecting an anomaly in said inert gas pipe, said reactive gas pipe, or said joint pipe by comparing a total value of a flow rate of said inert gas controlled in said step (a-1) and a flow rate of said reactive gas controlled in said step (a-2) with a measurement value of a flow rate of said treatment gas, acquired in said step (a-3); and
   (d) determining that there is an inert gas leakage in response to determining that a difference between the total value and the measurement value is more than the flow rate of said reactive gas controlled in said step (a-2).

5. The heat treatment method according to claim 4, wherein
   said inert gas is any gas selected from a group consisting of nitrogen, argon, and helium, and
   said reactive gas is any gas selected from a group consisting of ammonia, hydrogen, nitrous oxide, nitrogen trifluoride and oxygen.

6. The heat treatment method according to claim 4, wherein
   said substrate is irradiated with a flash of light from a flash lamp in said step (b).

* * * * *